United States Patent [19]

Haeussler et al.

[11] Patent Number: 4,831,631
[45] Date of Patent: May 16, 1989

[54] LASER TRANSMITTER COMPRISING A SEMICONDUCTOR LASER AND AN EXTERNAL RESONATOR

[75] Inventors: Klaus M. Haeussler, Munich; Julius Wittmann, Oberhaching; Gisela Gaukel, Munich; Franz Auracher, Baierbrunn, all of Fed. Rep. of Germany

[73] Assignee: Siemens Aktiengesellschaft, Berlin and Munich, Fed. Rep. of Germany

[21] Appl. No.: 76,838

[22] Filed: Jul. 23, 1987

[30] Foreign Application Priority Data

Sep. 29, 1986 [DE] Fed. Rep. of Germany ....... 3633076

[51] Int. Cl.$^4$ ................................................. H01S 3/08
[52] U.S. Cl. ......................................... 372/92; 372/6;
372/50; 372/96; 372/102; 372/108; 350/96.15
[58] Field of Search ................ 372/6, 92, 96, 98, 102,
372/108, 26, 32, 19, 50, 43; 350/96.14, 96.15, 96.19

[56] References Cited

U.S. PATENT DOCUMENTS

| 4,145,457 | 3/1979 | Kersten | 427/38 |
| 4,440,468 | 4/1984 | Auracher et al. | 350/96.12 |
| 4,515,431 | 5/1985 | Shaw et al. | 372/6 |
| 4,546,476 | 10/1985 | Shaw et al. | 372/6 |
| 4,674,830 | 6/1987 | Shaw et al. | 372/6 |
| 4,676,583 | 6/1987 | Hicks, Jr. | 372/6 |
| 4,720,160 | 1/1988 | Hicks, Jr. | 372/6 |
| 4,723,824 | 2/1988 | Shaw et al. | 372/6 |

FOREIGN PATENT DOCUMENTS

| 0180184 | 9/1985 | Japan | 372/32 |
| 8700699 | 1/1987 | World Int. Prop. O. | 372/92 |

OTHER PUBLICATIONS

E. Garmire; "Fiber and Integrated Optics: Waveguides in the Infrared"; Optical Spectra; Apr. 1979; pp. 50–54.
Kobayashi et al, "Microoptic Grating Multiplexers and Optical Isolators for Fiber-Optic Communications", *IEEE Journal of Quantum Electronics*, vol. QE-16, No. 1, Jan. 1980, pp. 11–22.
Barry, "Design and System Requirements Imposed by the Selection of GaAs/GaAlAs Single Mode Laser Diodes for Free Space Optical Communications", *IEEE Journal of Quantum Electronics*, vol. QE-20, No. 5, May 1984, pp. 478–491.
Wyatt et al, "10 kHz Linewidth 1–5 um InGaAsP External Cavity Laser with 55nm Tuning Range", *Electronics Letters* vol. 19, No. 3, Feb. 3, 1983, pp. 110–112.
Henry "Theory of the Linewidth of Semiconductor Lasers", *IEEE Journal of Quantum Electronics*, vol. QE-18, No. 2, Feb. 1982, pp. 259–264.
Wyatt, "Spectral Linewidth of External Cavity Semiconductor Lasers with Strong, Frequency-Selective Feedback", *Electronics Letters*, vol. 21, No. 15, Jul. 18, 1985, pp. 658–659.
Matthews et al, "Packaged Frequency-Stable Tunable 210kHz Linewidth 1.5 um In GaAsP External Cavity Laser", *Electronics Letters*, vol. 21, No. 3, Jan. 31, 1985, pp. 113–115.

(List continued on next page.)

*Primary Examiner*—William L. Sikes
*Assistant Examiner*—B. R. R. Holloway
*Attorney, Agent, or Firm*—Hill, Van Santen, Steadman & Simpson

[57] ABSTRACT

A laser transmitter comprising a semiconductor laser, and an external resonator in the form of an optical directional coupler characterized by feedback device being allocated to a first waveguide of the directional coupler and also a second feedback device allocated to the second waveguide of the coupler, each of the feedback devices returning a portion of the radiant energy in their respective waveguides back along the waveguide to the directional coupler and the output power of the transmitter being taken from the second waveguide of the directional coupler. Preferably, the section of each of the waveguides between the directional coupler and the respective feedback means has a different length with the difference being substantially in the magnitude of the length of the semiconductor laser. Preferably, the waveguides are strip waveguides integrally formed on a substrate and can include a modulator, as well as having the semiconductor laser also integrated on the substrate.

15 Claims, 2 Drawing Sheets

OTHER PUBLICATIONS

Spano et al, "Theory of Noise in Semiconductor Lasers in the Presence of Optical Feedback", *IEEE Journal of Quantum Electronics vol. QE-20, No. 4, Apr. 1984, pp. 350-357.*

Patzak, et al "Semiconductor Laser Linewidth in Optical Feedback Configurations", *Electronics Letters*, vol. 19, No. 24, Nov. 24, 1983, pp. 1026-1027.

Fye, "Relationship Between Carrier-Induced Index Change and Feedback Noise in Diode Lasers", *IEEE Journal of Quantum Electronics*, vol. QE-18, No. 10, Oct. 1982, pp. 1675-1678.

Smith, "Stablized; Single-Frequency Output from a Long Laser Cavity", *IEEE Journal of Quantum Electronics*, vol. QE-1, No. 8, Nov. 1965, pp. 343-348.

Becker, "Multigigahertz Lumped-Element Electrooptic Modulators", *IEEE Journal of Quantum Electronics*, vol. QE-21, No. 8, Aug. 1985, pp. 1144-1146.

Auracher et al, "High-Speed $\Delta\beta$-Reversal Directional Coupler Modulator with Low Insertion Loss for 1.3 $\mu$m in LiNbO$_3$", *Journal of Optical Communications*, vol. 5, 1984, pp. 7-9.

Buchmann et al, "GaAs Waveguide-Modulators and Directional Couplers with Low Losses for High Speed Operation at 1.3 $\mu$m", *EDCOC 83-9th*, European Conference on Optical Communication, 1983, pp. 539-542.

Buchmann et al, "Broadband $\gamma$-Branch Electro-Optic GaAs Waveguide Interferometer for 1.3 $\mu$m", *Applied Physic Letter*, vol. 46, No. 5, Mar. 1, 1985, pp. 462-464.

LASER TRANSMITTER COMPRISING A SEMICONDUCTOR LASER AND AN EXTERNAL RESONATOR

BACKGROUND OF THE INVENTION

The present invention is directed to a laser transmitter comprising a semiconductor laser and an external resonator wherein the optical external resonator is in the form of an optical directional coupler which is composed of two light waveguides that extend next to one another with such a slight distance therebetween over a defined coupling length or zone that a power cross-over between the waveguides will occur in the coupling length or zone. The two waveguides and the semiconductor laser are coupled together so that the one waveguide has a feedback device allocated to it so that at least one part of the radiant intensity supplied to the feedback device from the coupling length is conducted back into the coupling length and the output power of the transmitter can be taken from the other waveguide of the resonator which will cause a wavelength selectivity for the transmitter.

A transmitter of this type is proposed in the earlier German Patent application No. P 36 00 726.9, whose disclosure was incorporated in U.S. patent application, Ser. No. 906,503, filed Sep. 12, 1986. In this application, a transmitter is disclosed wherein a feedback means, which is partially transmissive, is allocated to one of the optical waveguides. Part of the radiant intensity which is passed through the feedback means is supplied through a loop-shaped optical waveguide to the other optical waveguide at the one side of the coupling path at which the semiconductor laser is arranged. With such a laser transmitter, the extremely narrow banded, single-mode operating condition can be achieved as required for the future, fiber-optical communications systems, particularly having heterodyne and homodyne reception.

Such a laser transmitter exhibits the advantages that the coupling of the resonator and of the system fiber to the semiconductor laser can occur at only one side of the semiconductor laser in contrast to other known embodiments of laser transmitters where the system fibers are connected to one side of the semiconductor laser while the resonator is coupled to the opposite side of the semiconductor laser. As a result of the one-sided coupling, adjustment problems are considerably reduced and the requirement of a high mechanical stability in the coupling of the system fiber and of the external resonator can be better met.

SUMMARY OF THE INVENTION

The object of the present invention is to provide a specific novel design of a transmitter having a semiconductor laser and external optical resonator, which design uses a single-sided coupling which requires no loop-shaped waveguide and wherein a single-mode operation can also be achieved in an extremely simple way.

These objects are achieved by improvements in a laser transmitter having a semiconductor laser and an external, optical resonator, said optical resonator being in the form of an optical directional coupler which is composed of two waveguides proceeding next to one another at a slight distance over a defined coupling length so that a power cross-over between the waveguides will occur in the coupling length or zone, one of the two waveguides and the semiconductor laser being coupled together and has a feedback means allocated to it which will cause at least a part of the radiant energy supplied to the feedback device by the one waveguide from the coupling length to be conducted back into the coupling length and an output power of the transmitter can be taken from the other of the two waveguides. The improvements are that feedback means are also allocated to the other or second waveguide and this feedback means causes at least one part of the radiant energy supplied to it by the second waveguide from the coupling length to be conducted back in the second waveguide and into the coupling length.

The laser transmitter of the present invention represents analogue to that which is referred to as a Fox-Smith resonator (See *IEEE J Quantum Electronics*, Vol. QE-1 (1965), pages 343 ff), which is utilized in classic lasers having three beam propagations in order to achieve a mode selection. However, in contrast to the "classic" arrangement, the external resonator lies outside of the amplifying media of the laser transmitter in the present invention.

A single-mode operation in the laser transmitter of the invention can be achieved in the simplest possible way, wherein the optical spacing between the coupling length and each of the feedback devices for each of the two waveguides differs from one another by a spacing difference which lies on an order of magnitude to the length of the semiconductor laser in terms to its amount.

Advantages of this embodiment of the laser transmitter of the invention may be seen in the following ways:

(i) The required, optical spacing $l_1$ and $l_2$, which are usually realized by fibers or waveguide lengths and, thus, the resonator configuration can be adjusted separately from the semiconductor laser itself;

(ii) Thermal influences are less crucial for the mode suppression; and (iii) Only the optical distance between the semiconductor laser and the optical directional coupler generally realized by optical lengths of the fiber piece or, respectively, the coupling path, of the directional coupler itself must be stabilized.

Advantageously, the optical directional coupler forming the optical resonator is a wavelength selective directional coupler.

The optical directional coupler, however, can be a fiber directional coupler, but can also be a directional coupler integrated on a substrate which, for example, can be generated by manufacturing the coupled waveguides by means of an ion exchange process on a glass substrate or by means of an in-diffusion of titanium into a lithium niobate crystal.

The preferred embodiments of the laser transmitter comprising an integrated, optical directional coupler can include an integration of the semiconductor laser on the same substrate.

Other advantages and features of the present invention will be readily apparent from the drawings, the description of the preferred embodiments and claims.

DESCRIPTION OF THE PREFERRED EMBODIMENTS

Figure 1:
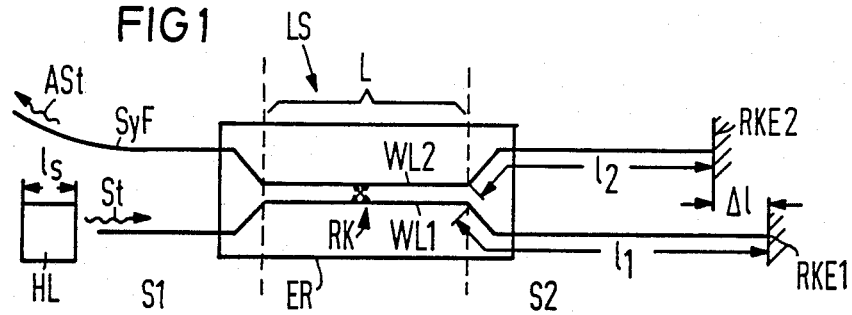
FIG. 1 is a schematic illustration of a fundamental structure of a laser transmitter comprising a one-sided coupling of the external resonator in accordance with the present invention.

The principals of the present invention are particularly useful in a laser transmitter, which is generally indicated at LS in FIG. 1. The laser transmitter LS comprises a semiconductor laser HL and an external, optical resonator ER. The resonator ER is fashioned in the form of an optical directional coupler RK, which is composed of two light waveguides WL1 and WL2, which proceed next to one another with a slight distance therebetween over a defined coupling length or zone L so that a cross-over of radiation between the waveguides WL1 and WL2 will occur in the coupling length or zone L.

As illustrated in FIG. 1, the coupling length L has a first side S1 and a second side S2. The first waveguide WL1 on the first side S1 is coupled to the semiconductor laser HL and at the second side S2 has a feedback means RKE1. The feedback means RKE1 causes at least a part of the radiation intensity supplied to it from the first waveguide WL1 to be conducted back into the waveguide LW1 and into the coupling length L.

The second or other waveguide WL2 also has a feedback means RKE2, which is positioned, for example, on the second side S2 of the coupling length L. The feedback means RKE2 also causes at least one part of the radiation intensity supplied to the feedback means by the second waveguide WL2 to be conducted back into the second waveguide WL2 and to the coupling length L.

An output power ASt of the transmitter LS is taken from the second waveguide WL2 at the first side S1 of the coupling length L.

The feedback means RKE1 and RKE2 cause radiant intensity St, which is emitted by the semiconductor laser, to be partly fed back into the semiconductor laser HL and can be simultaneously supplied into the system fiber SyF in accordance with the division ratio of the directional coupler RK. This represents the said analogue to the Fox-Smith resonator.

Over and above this, the optical length or spacing $l_1$ between the coupling length or zone L and the feedback means RKE1 along the first waveguide WL1 and the optical length or spacing $l_2$ between the coupling length or zone L and the feedback means RKE2 allocated to the second waveguide WL2 differ by a spacing or length difference $\Delta l$, which lies in the order of magnitude of the length $l_s$ of the semiconductor laser HL in terms of its amount. The optical spacing between the coupling zone and the feedback means denotes a defined transit time of the radiation from the coupling zone to the feedback means and back so that a greater optical spacing means a longer transit running time.

A single-mode operation of the laser can be achieved on the basis of this measure. This is based on the fact that both the effective transmissivity of the external resonator ER having the two feedback means RKE1 and RKE2, as well as the effective frequency-dependent reflectivity of the two feedback means RKE1 and RKE2, which determine a reaction onto the semiconductor laser HL containing an interference term which is proporational to $$R_1 \cdot R_2 \cdot \cos(\phi_1 - \phi_2)$$

whereby $R_1$ and $R_2$ are the effective amplitude reflectivities of the feedback devices RKE1 and RKE2, respectively; $\phi_1$ denotes the phase relation with the radiation component after traversing of the optical spacing $l_1$ from the coupling length L to the one feedback means RKE1 and back, while the $\phi_2$ denotes the phase relation of the radiation component after traversing the optical spacing $l_2$ from the coupling length L to the other feedback means RKE2 and back to the coupling length L.

The mode spectrum of the free-running laser transmitter LS, i.e., the laser transmitter LS operating without the feedback device RKE1 and RKE2, thus, has an interference structure overlaid onto it. The maximum and minimum of this interference structure have a frequency spacing of $$\Delta f = c/2n \ (l_1 - l_2)$$

wherein c denotes the speed of light in a vacuum and n denotes the refractive index of the radiation-guiding medium between the coupling length L and the feedback RKE1 and RKE2.

Given a suitable length difference of $\Delta l = l_1 - l_2$, a single-mode operation of the laser can be achieved by suppressing the neighboring modes with the reaction being frequency selective, whereby the length difference $\Delta l$ must lie on the order of magnitude of the length $l_s$ of the semiconductor HL for this purpose.

In the integrated-optical embodiments of the laser transmitter LS, in accordance with FIGS. 2–6, the two light waveguides WL1 and WL2 are composed of strip waveguides which are integrated on a surface of a substrate Str. This surface is shown in a plan view in FIGS. 2–6.

For example, the substrate may be composed of lithium niobate. Modulators and directional coupler structures have already been known as being formed on this type of material (see in this regard the discussions from *J. Lightwave Technology*, Vol. LT-3 (1985), pp. 1–6; *J. of Optical Communication* Vol. 5 (1984), pp. 7–9; or *IEEE J. Quant. Electronics* Vol. QE-21 (1985), pp. 1144–1146. The strip waveguides are preferably formed in this substrate as diffused waveguides.

In all embodiments of FIGS. 2–6, at least the second strip waveguide WL2 proceeds from one end face EF1 to the other end face EF2 of the substrate Str. These end faces EF1 and EF2 extend perpendicular to the surface Str, as shown in the plan view.

Figure 2:
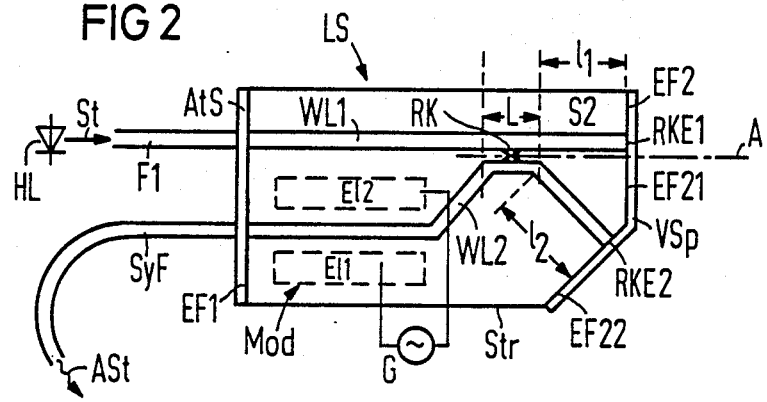
FIG. 2 is a plan view of a first embodiment of a laser transmitter of the present invention having an integrated, optical external resonator which is to be coupled to a separate laser element.
Figure 3:
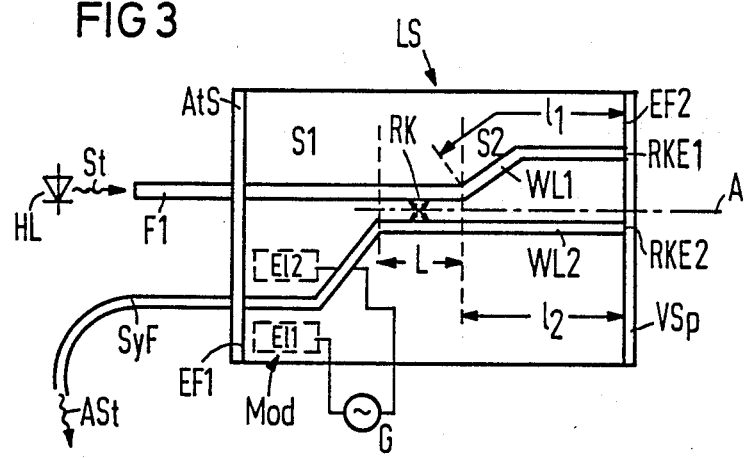
FIG. 3 is a plan view of a second embodiment of a laser transmitter of the present invention with an integrated optical external resonator for coupling to a separate semiconductor laser.

In the embodiments of FIGS. 2 and 3, the one or first strip waveguide WL1 also proceeds from the one end face EF1 to the other end face EF2. These end faces EF1 and EF2 and, thus, the ends of the strip waveguides WL1 and WL2, lying in them are expediently planar polished. The coupling of the radiant intensity St emitted by the semiconductor laser HL into the first strip waveguide WL1 and the coupling of the output power ASt from the second strip waveguide WL2 into the system fiber SyF occurs via the end faces EF1 situated at the one side S1 of the coupling length L of the two strip waveguides WL1 and WL2. An anti-reflection coating AtS is applied to the end face EF1 for this purpose. The coupling of the semiconductor laser HL to the one or first strip waveguide WL1 can occur by a fiber F1 or by conventional optics, which are not shown. The coupling of the system fiber SyF to the other strip waveguide WL2 can occur directly or can, likewise, be accomplished by means of optics, which are conventional and are not shown.

The other end face EF2 of the substrate Str is situated at the other side S2 of the coupling length L. The feedback devices RKE1 and RKE2, which are allocated to the two strip waveguides WL1 and WL2, are realized by a mirror layer VSp, which is applied to the other end face EF2. The optical spacing $l_1$ and $l_2$ are defined by the lengths of the sections of the appertaining waveguides WL1 and WL2, respectively, between the coupling length or zone L and the other end face EF2, which extends perpendicularly to these waveguides WL1 and WL2.

The different optical spacings $l_1$ and $l_2$ can be achieved in a simple way in that the two sections of the strip waveguides WL1 and WL2 between the coupling length L and the other end face EF2 proceed asymmetrically relative to a center axis A of the strip waveguide pair within the coupling length L. In the embodiment of FIG. 2, this asymmetry is established in that a section of the waveguide WL1 proceeds parallel to the axis A whereas the section of the second waveguide WL2 proceeds on a straight line at an angle relative to the center axis A. In addition, the mirror or other end face EF2 is divided into two sections or portions EF21 and EF22, with the section EF21 extending perpendicular to the waveguide WL1, while the section EF22 extends perpendicular to the above-mentioned section of the waveguide WL2. Thus, the two sections EF21 and EF22 merge at an angle relative to each other and they are arranged so that the lengths $l_1$ and $l_2$ of the two sections are different from one another.

The angled end face of FIG. 2 can be avoided when the waveguide, which has a section that continues from the coupling length L at an angle relative to the center axis of the strip waveguide pair merges into an end section that extends parallel to the center axis A. This end section will abut perpendicularly against the planar end surface EF2, such as illustrated in FIG. 3.

Figure 4:
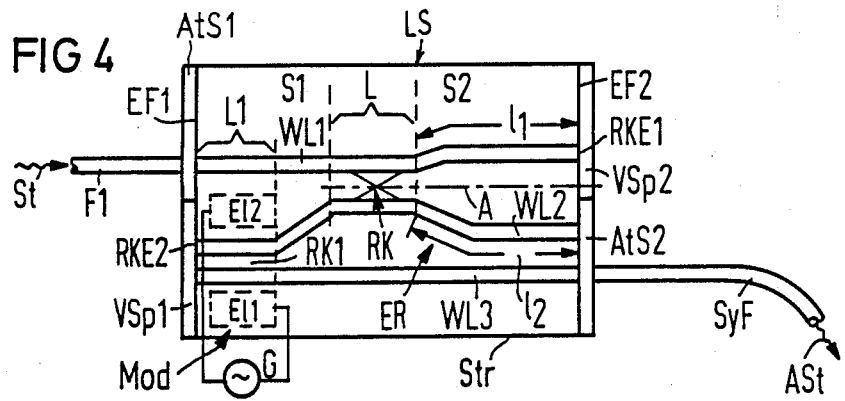
FIG. 4 is a plan view of a third embodiment of a laser transmitter of the present invention having an integrated optical external resonator which is coupled to a separate semiconductor laser.

The embodiment of FIG. 4 differs from the embodiments of FIGS. 2 and 3 essentially because the radiant intensity St of the semiconductor laser HL is coupled into the first strip waveguide WL1 via the one end face EF1 and the feedback device RKE2, which is allocated to the second strip waveguide WL2 is also provided at this one end face EF1 in the form of a partial mirroring VSp1 at this end face EF1. The feedback device RKE1, which is allocated to the first strip waveguide WL1, is provided at the other end face EF2 in the form of a partial mirroring VSp2 and the coupling of the output power ASt of the transmitter LS into the system fiber SyF occurs at the other end face EF2. To this end, a third strip waveguide WL3 is coupled to the second strip waveguide WL2 in the region of the partial mirroring VSp1 and is provided on the substrate Str to extend between the first end face EF1 to the second end face EF2.

The coupling of the third strip waveguide WL3 to the second waveguide WL2 occurs, for example, by an optical directional coupler RK1, which can be fashioned like the optical directional coupler RK. For example, the second waveguide WL2 and the third waveguide WL3 proceed next to one another at a small spacing over a definite coupling length L1 so that a power coupling between these two waveguides can occur. Thus, the special characteristics are established because this coupling length L1 is provided with a mirroring VSp1 at one side or end.

The coupling of the radiant intensity or energy St from the semiconductor laser HL into the one strip waveguide WL1 and the coupling of the output energy ASt from the third waveguide WL3 into the system fiber SyF expediently, again, occurs via antireflection layers, such as AtS1 and AtS2, which are applied to the sub-regions of the particular end faces EF1 or EF2, respectively, of the substrate Str.

Figure 5:
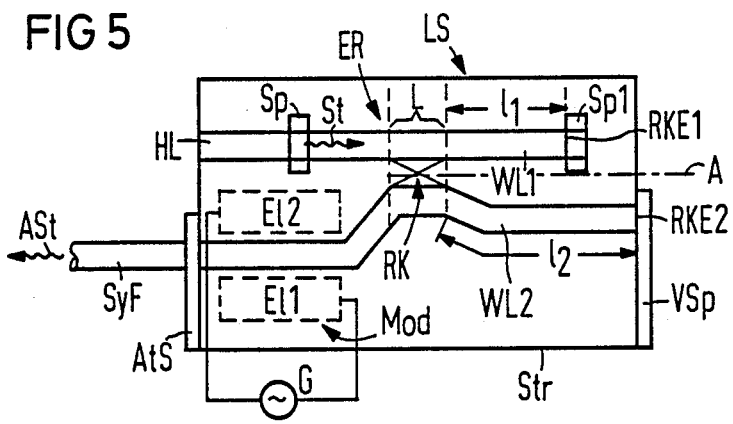
FIG. 5 is a plan view of a laser transmitter of the present invention having an optical directional coupler as an external resonator in a monolithically integrated optical execution with the semiconductor laser.
Figure 6:
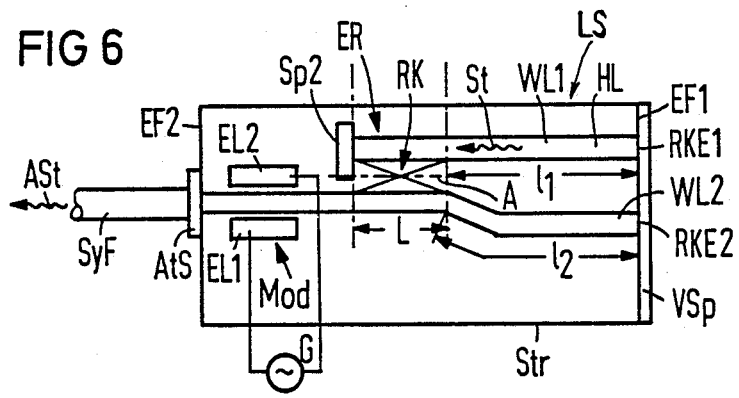
FIG. 6 is a plan view of another embodiment of the laser transmitter of the present invention having the optical directional coupler as an external resonator in a monolithically integrated optical execution with the semiconductor laser.

The integrated-optical embodiments of FIGS. 5 and 6 differ from the embodiments of FIGS. 2 and 3 essentially in that the semiconductor laser HL is monolithically integrated on the substrate Str together with the external resonator.

In the embodiment of FIG. 5, the semiconductor laser HL is fashioned in the form of a strip laser which is coupled to the one or first strip waveguide WL1 of the resonator ER by an etched mirror SP or by a Bragg grating.

In the embodiment of FIG. 6, the overall one-strip waveguide WL1 of the external resonator ER is fashioned as a strip laser which forms a semiconductor laser HL and which comprises the section of the length $l_1$ of this first waveguide WL1 between the coupling length L and the one feedback device RKE1. At the side of the coupling length L facing away from the feedback device RKE1, the one waveguide WL is limited by an etched mirror Sp2 or by an etched Bragg grating.

Given employment of a substrate of electro-optical material, for example $LiNbO_3$, the modulators for the modulation of the output or of the laser transmitter can also be integrated on the substrate in all integrated-optical embodiments as required, for example, in an optical communication technology.

Such a modulator Mod is provided in all the integrated embodiments of the laser transmitter LS of FIGS. 2–6. For example, the modulator Mod can be composed of two electrodes E11 and E12, which are arranged on the substrate Str at both sides qf the second waveguide WL2 and are, for example, connected to a generator, which can be applied to modulating voltage difference. The output power ASt of the laser transmitter conducted in the second waveguide WL2 is, thus, modulated by the modulator Mod.

In the embodiment of FIG. 4, there is a special characteristic that the modulator Mod arranged in the region of the directional coupler RK1 is utilized in reflection. Given this transmitter, the in-coupling and out-coupling can thereby occur at opposite sides EF1 and EF2 of the substrate in contrast to the comparable embodiments of FIGS. 2 and 3, where the in-coupling and out-coupling occur in the same side of the substrate.

Let it be pointed out that the modulator structure and the coupler structure have already been realized in LiNbO₃ crystal. For example, see in this regard the articles in *J. Lightwave Technology* Vol. LT-3 (1985), pages 1-6; *J. of Optical Communications* Vol. 5, (1984), pages 7-9; or *IEEE J. Quant. Electron.* Vol. QE-21 (1985), pages 1144-1146.

In the case of IGaAsP or GaAlAs substrate material, cleavage faces can be utilized instead of the mirroring. The manufacture of these cleavage faces can be easily controlled.

In the integrated-optical embodiments of FIGS. 5 and 6, the losses of the directional coupler coupled to the semiconductor laser due to pumping of the waveguides can be kept low. Likewise, a tuning of the emitted wavelength by different pumping currents in the two waveguides of the directional coupler is also possible.

The modulators in the embodiments of FIGS. 2-6 can be phase modulators or intensity modulators in the standard arrangement. Examples are disclosed in articles in *J. Lightwave Technol.* Vol. LT-3 (1985), pages 1-6; *J. of Optical Communications* Vol. 5 (1984), pages 7-9; *IEEE J. Quant. Electron.* Vol. QE-21 (1985), pages 1144-1146; *ECOE 83-9th European Conf. on Optical Commun.*, H. Melchior, A. Sallberger, Elsevier Science Publishers B.V. (North Holland) 1983; or *Appl. Phys. Lett.* Vol. 5 (1985), pages 462-464. When a phase modulator is arranged inside of the external resonator, then a frequency-modulated output signal is obtained.

It is expedient to mirror the side of the semiconductor laser facing away from the external resonator ER. As a result thereof, the optical power increase, given the same pump system, increases due to the lowering of the threshold current and the sensitivity of the parasitic reflections is reduced. This is true of all laser transmitter comprising external resonators and single-sided coupling, for example, wherein the output power is taken at the side of the resonator.

Although various minor modifications may be suggested by those versed in the art, it should be understood that we wish to embody within the scope of the patent granted hereon all such modifications as reasonably and properly come within the scope of our contribution to the art.

We claim:

1. In a laser transmitter having a semiconductor laser and an external, optical resonator, said optical resonator being in the form of an optical directional coupler which is composed of first and second light waveguides proceeding next to one another to form a coupling zone so that a power cross-over between the waveguides will occur in the coupling zone, each of the first and second light waveguides having first and second ends, the first waveguide having a first end being coupled to the semiconductor laser and a second end of the first waveguide having feedback means for returning a portion of the radiant intensity being supplied in the first waveguide from the coupling zone back into the first waveguide and into the coupling zone and the output power of the transmitter being removed from the second waveguide, the improvements comprising the first and second waveguides being arranged with their second ends being on one side of the coupling zone and second feedback means being provided on the second end of the second waveguide, said second feedback means causing at least one part of the radiant intensity being supplied to the second feedback means in the second waveguide from the coupling zone to be returned through the second waveguide to the coupling zone.

2. In a laser transmitter according to claim 1, wherein the optical length along each of the waveguides between their respective feedback means and the coupling zone of the coupler differ from one another by a length difference which lies in the order of magnitude of the length of the semiconductor laser.

3. In a laser transmitter according to claim 2, wherein the optical directional coupler is a wavelength selective directional coupler.

4. In a laser transmitter according to claim 2, wherein the directional coupler is a fiber directional coupler.

5. In a laser transmitter according to claim 2, wherein the directional coupler is integrated onto a substrate.

6. In a laser transmitter according to claim 5, wherein both the first and second waveguides are composed of strip waveguides integrated on the shared substrate, both of the first and second feedback means are composed of reflectors fixed on the substrate at the allocated waveguide.

7. In a laser transmitter according to claim 6, wherein the reflectors allocated to the waveguides are composed of mirror layers applied to an end face of the substrate.

8. In a laser transmitter according to claim 6, wherein the reflectors allocated to the waveguides are composed of mirrors etched into the substrate in the region of the allocated waveguide.

9. In a laser transmitter according to claim 6, wherein at least one of the reflectors allocated to the waveguides is a Bragg grating etched into the substrate at the second end of the allocated waveguide.

10. In a laser transmitter according to claim 5, wherein the semiconductor laser is integrated onto said substrate.

11. In a laser transmitter according to claim 10, which includes a modulator for modulating the radiant intensity conducted in one of the strip waveguides, said modulator being integrated onto said substrate adjacent said one waveguide.

12. In a laser transmitter according to claim 6, which includes a modulator for modulating the radiant intensity conducted in one of the strip waveguides, said modulator being integrated on said substrate adjacent said one waveguide.

13. In a laser transmitter according to claim 1 wherein the sections of the waveguide extending between the coupling length zone and each of the feedback means allocated to the waveguides extend asymmetrically relative to a center axis of the light waveguides within the coupling length zone.

14. In a laser transmitter according to claim 1 wherein the first waveguide has a section extending between the coupling zone and the first feedback means, said second waveguide having a section extending between the coupling zone and the second feedback means, said sections of the first and second waveguides proceeding asymmetrically relative to a center axis of the two waveguides within the coupling zone so that the optical spacing along the section of the first waveguide and the optical spacing along the section of the second waveguide differ from one another by a spacing difference which lies in the order of the magnitude of a length of the semiconductor laser of the transmitter.

15. In a laser transmitter according to claim 1, which includes a third waveguide having a portion forming a second directional coupler with the second waveguide, said third waveguide being connected to a fiber of an optical system for coupling output from the transmitter.

* * * * *